(12) United States Patent
Becker et al.

(10) Patent No.: US 8,766,209 B2
(45) Date of Patent: Jul. 1, 2014

(54) CURRENT LIMITER FOR HIGH VOLTAGE POWER SUPPLY USED WITH ION IMPLANTATION SYSTEM

(75) Inventors: Klaus Becker, Kensington, NH (US); Klaus Petry, Merrimac, MA (US); Piotr Lubicki, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 483 days.

(21) Appl. No.: 13/187,905

(22) Filed: Jul. 21, 2011

(65) Prior Publication Data

US 2013/0020940 A1 Jan. 24, 2013

(51) Int. Cl.
*H01J 27/00* (2006.01)
(52) U.S. Cl.
USPC .................................. 250/423 R; 315/111.81

(58) Field of Classification Search
CPC ............. H01J 21/00; H01J 27/02; H01J 27/00
USPC ................ 250/423 R, 423 P, 423 F, 426, 427; 315/111.81
See application file for complete search history.

(56) References Cited

U.S. PATENT DOCUMENTS

| | | |
|---|---|---|
| 3,497,743 A | 2/1970 | Walch et al. |
| 4,594,630 A | 6/1986 | Rabinowitz et al. |
| 7,247,863 B2 * | 7/2007 | Berrian .................... 250/427 |
| 7,345,856 B2 | 3/2008 | Regan |
| 7,655,930 B2 * | 2/2010 | Huang et al. ............. 250/492.21 |
| 2006/0087244 A1 | 4/2006 | Regan |
| 2009/0145228 A1 | 6/2009 | Tekletsadik et al. |

* cited by examiner

*Primary Examiner* — Thuy Vinh Tran

(57) ABSTRACT

Disclosed is a surge protection system for use with an ion source assembly. The system comprises a high voltage power source coupled in series with a thermionic diode and an ion source assembly. The high voltage power supply is enclosed in the pressure tank and drives the ion source assembly. The thermionic diode is comprised of an insulating tube disposed between the ion source assembly enclosure and the output of the high voltage power supply and makes use of existing ion source assembly components to limit damage to the power supply during arc failures of the ion source assembly.

18 Claims, 6 Drawing Sheets

CURRENT LIMITER FOR HIGH VOLTAGE POWER SUPPLY USED WITH ION IMPLANTATION SYSTEM

BACKGROUND OF THE INVENTION

1. Field of the Invention

Embodiments of the invention relate to the field of semiconductor device fabrication. More particularly, the present invention relates to an apparatus for suppressing current surges resulting from arc discharges during the use of ion implantation equipment.

2. Discussion of Related Art

Ion implantation is a process used to dope impurity ions into a target substrate to obtain desired device characteristics. An ion beam is directed from an ion source chamber toward the target substrate. The depth of implantation into the target substrate is based on the ion implant energy and the mass of the ions generated in the source chamber.

FIG. 1 is a block diagram of a typical ion implanter system. A high voltage power supply 10 supplies the required energy to anion source chamber 12 which is configured to generate ions of a particular species. The generated ions are extracted from the source through a series of electrodes 14 and formed into a beam 16, which is accelerated by the voltage from power supply 10. The voltage applied can range from a few kV to several hundred kV. In some applications several power supplies may be stacked to achieve even higher voltages. The extracted beam passes through a mass analyzer magnet 18. The mass analyzer is configured with a particular magnetic field such that only the ions with a desired mass-to-charge ratio are able to travel through the analyzer. Ions of the desired species pass through a resolving slit 20 and a number of beam shaping elements 22, 24, 26, which prepare them for implantation and direct them toward a work piece or substrate positioned on support (e.g. platen) 28. Corrector magnet 24 is energized to deflect ion beamlets in accordance with the strength and direction of the applied magnetic field to provide a ribbon beam targeted toward a work piece or substrate positioned on support (e.g. platen) 28.

Generally, such high voltages are applied via electrodes supplied by high voltage power supplies. The design of such high voltage power supplies must take into account the possibility of overheating, flashover, and unintended voltage arcing during prolonged usage. In addition, since these power supplies operate at such high voltages, failure rates over time increase as compared to power supplies that operate at lower voltage levels.

A frequent failure of the system described above is arcing from a high voltage electrode to another part of the system. There are many causes for arcs and they are considered unavoidable, even for well designed systems. Typical implanter specifications allow 10 or more arcs per hour. It is a characteristic of arcs that they represent a negative impedance. Without additional current limiting elements in the circuit, arcs can cause high current surges that damage or wear out power supplies and other components.

FIG. 2 illustrates a schematic of an exemplary prior art ion source assembly utilizing a resistor as a current limiting component for the high voltage power supply. Typically, a resistor 207 is coupled in series between a high voltage power supply 203 and an ion source assembly 209 to limit the effects of any arc 211 induced current spikes. Resistors, however, are linear components and the high voltage drop caused by an arc, for example from an ion source assembly to ground still causes a proportionally higher current to flow.

The present invention through its embodiments replaces the high value resistor coupled between the high voltage power supply and anion source assembly with a thermionic diode. A thermionic diode is a non-linear component and as such will limit the amount of current that can be passed regardless of the voltage.

SUMMARY OF THE INVENTION

In a first embodiment there is disclosed is a thermionic diode assembly surge protection system for use with an ion source assembly. The system comprises a high voltage power source coupled in series with a thermionic diode and an ion source assembly. The ion source assembly includes an ion source, an enclosure having an outer skin surface, a fluid connection assembly that couples a vacuum section of the ion source with a thermionic diode housing, and a cathode located at a first end of the ion source tank. The cathode is comprised of a cathode filament power supply and a cathode filament disposed within the fluid connection assembly and mounted substantially flush with the outer skin surface of the enclosure. The high voltage power supply is enclosed in source pressure tank and drives the ion source assembly. The thermionic diode housing is comprised of an insulating tube disposed between the ion source assembly enclosure and the output of the high voltage power supply. The insulating tube is mounted on one end to an endplate of the pressure tank proximate to the cathode so as to form a vacuum seal with the outer skin surface of the ion source assembly enclosure. The insulating tube is sealed on the other end by an anode that is coupled with the output of the high voltage power supply.

In another embodiment a thermionic triode assembly surge protection system for use with an ion source assembly is disclosed. The system comprises a high voltage power source coupled in series with a thermionic diode and an ion source assembly. The ion source assembly includes an ion source and an enclosure having an outer skin surface wherein the outer skin surface is perforated in a region such that a grid is formed between a cathode and an anode. The ion source assembly further includes a fluid connection assembly that couples a vacuum section of the ion source with a thermionic triode housing, and a cathode located at a first end of source pressure tank. The cathode is comprised of a cathode filament power supply and a cathode filament disposed within the fluid connection assembly and mounted substantially flush with the outer skin surface of the ion source assembly enclosure. The high voltage power supply is enclosed in the pressure tank and drives the ion source assembly. The thermionic triode housing is comprised of an insulating tube disposed between the ion source assembly enclosure and the output of the high voltage power supply. The insulating tube is mounted on one end to an endplate of ion source tank proximate to the cathode so as to form a vacuum seal with the perforated outer skin surface of the ion source assembly enclosure. The insulating tube is sealed on the other end by an anode that is coupled with the output of the high voltage power supply.

The embodiments of the present disclosure limit excessive current during failures resulting from an arc between anion source assembly and the ground return path of a high voltage power supply. In addition, compared to the thermionic diode assembly, the thermionic triode assembly will provide additional ion source assembly shielding during such failures.

DESCRIPTION OF EMBODIMENTS

Figure 1:
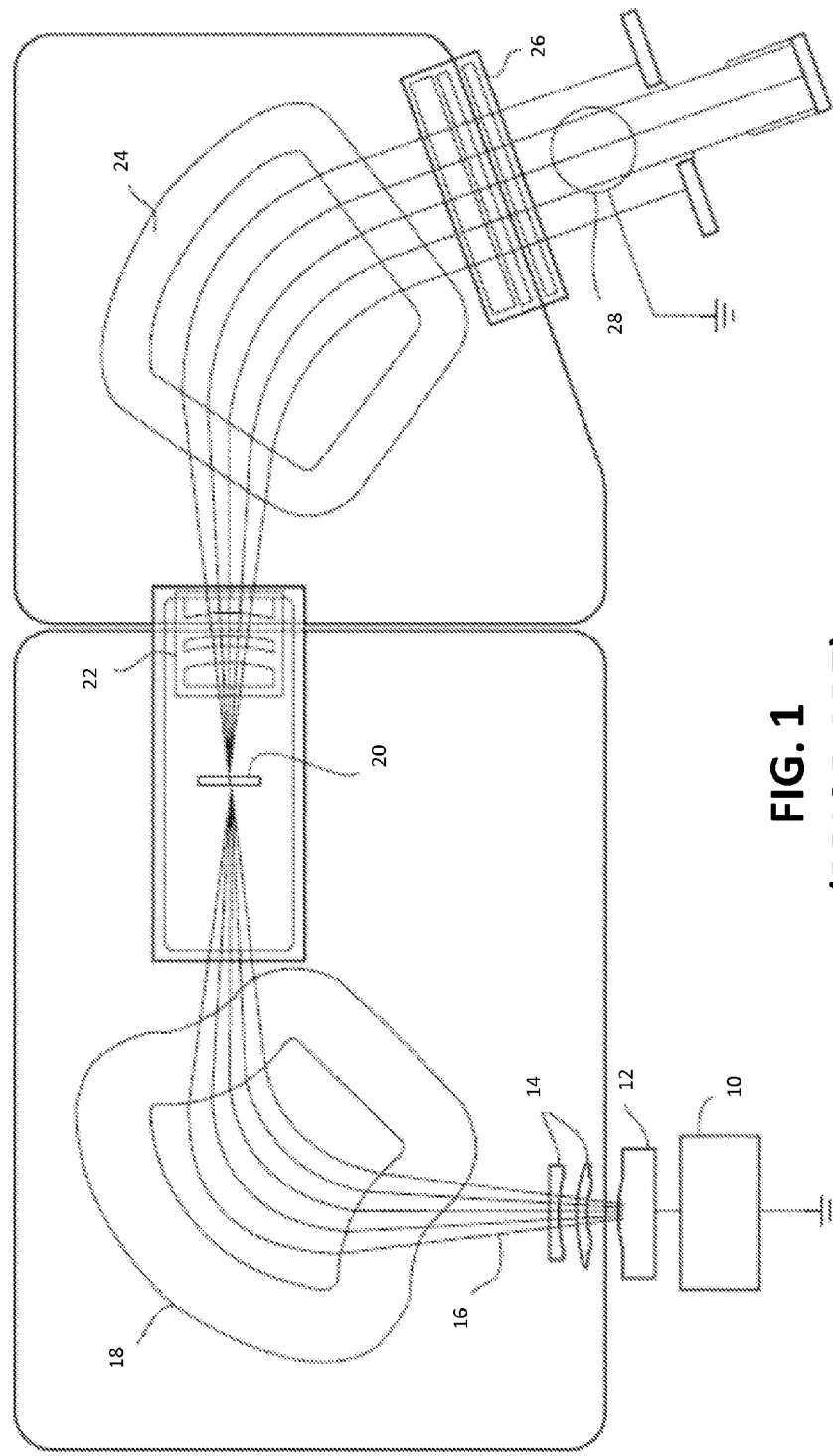
FIG. 1 illustrates a block diagram of a representative ion implantation system.
Figure 2:
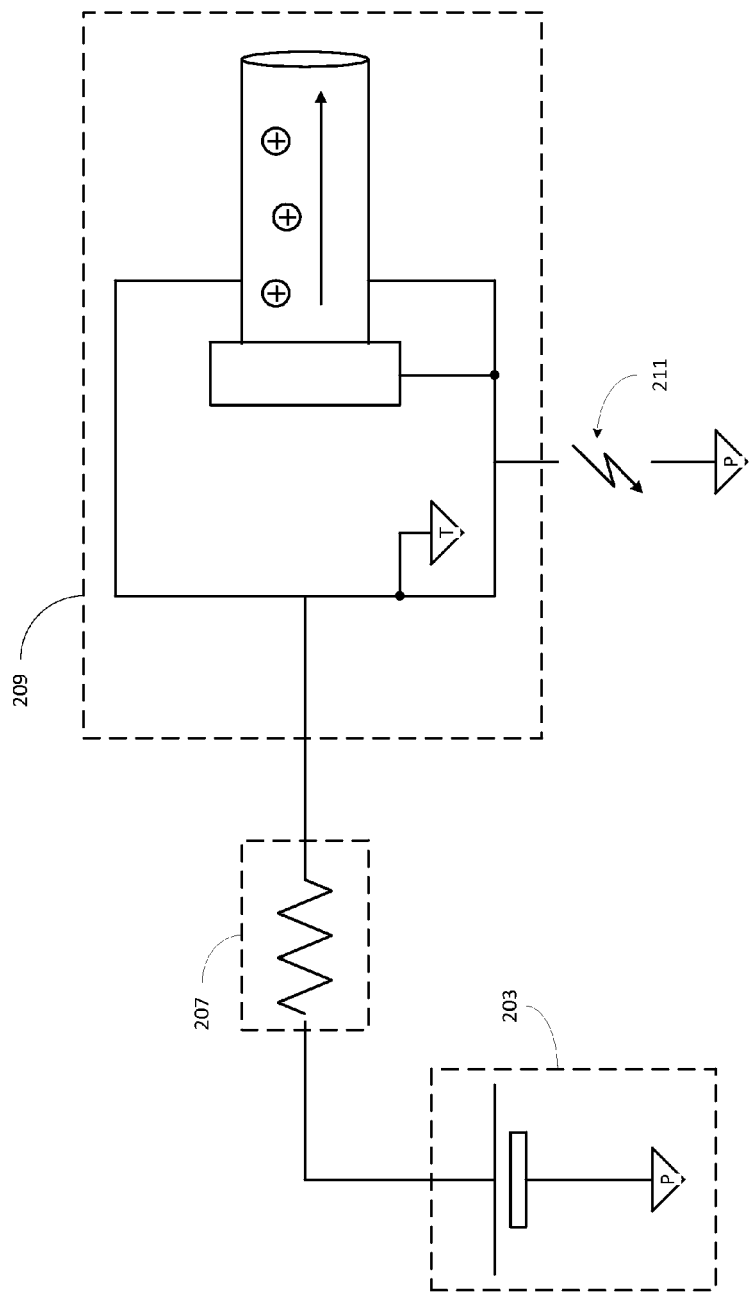
FIG. 2 illustrates a prior art circuit diagram of an ion source assembly utilizing a linear resistor as a current limiting component for a high voltage power supply.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Nearly all high voltage power supplies used to power ion implantation systems employ anti-surge series resistor(s) at the output to prevent self-destruction from a load arc. High voltage power supplies are utilized in ion implantation systems to produce acceleration energies necessary to implant ions into a target substrate. One example of a high voltage power supply typically used in ion implanters is a Cockcroft-Walton power supply. A Cockcroft-Walton power supply is an electric circuit that generates a high DC voltage from a low voltage AC or pulsing DC input. The Cockcroft-Walton power supply is made up of a voltage multiplier ladder network of capacitors and diodes used to generate high voltages. Unlike transformers, this ladder method eliminates the requirement for the heavy core and the bulk of insulation/potting required. Using only capacitors and diodes, these voltage multipliers can step up relatively low voltages to extremely high values, while at the same time being far lighter and cheaper than transformers. Cockcroft-Walton power supplies are typically used to develop higher voltages for relatively low current applications such as, for instance, ion implantation systems.

A high value resistor will effectively protect against such a current surge from a high voltage power supply. However, a resistor will also cause a high voltage drop during normal operation (e.g., several kV in typical designs) since the resistor is a linear device since voltage is linearly proportional to resistance according to the equation V=IR where V is voltage, I is current, and R is resistance. Thus, when R is increased so too is the voltage drop across that resistor. Conversely, a low value resistor will operate well during normal operation but offers substantially less protection against a voltage surge when the applied voltage could be amplified by a factor of 1000 or more. This is due to the fact that the low value resistor is not equipped to handle a high voltage without a detrimental increase in current.

Connecting such a high voltage power source to a device, such as an electrode, within a vacuum chamber typically involves an insulated high voltage feed-through which is sealed within a passage through a wall of the chamber. The high voltage feed through generally combines metal components for strength or conductivity and ceramic components for insulating high voltage conductors from the wall of the chamber. Such high voltage feed-throughs are useful for a variety of connections, including connections between external power sources and electrical devices within vacuum processing chambers. The high voltage feed-throughs are designed to seal ambient conditions from a vacuum within a chamber.

Figure 3:
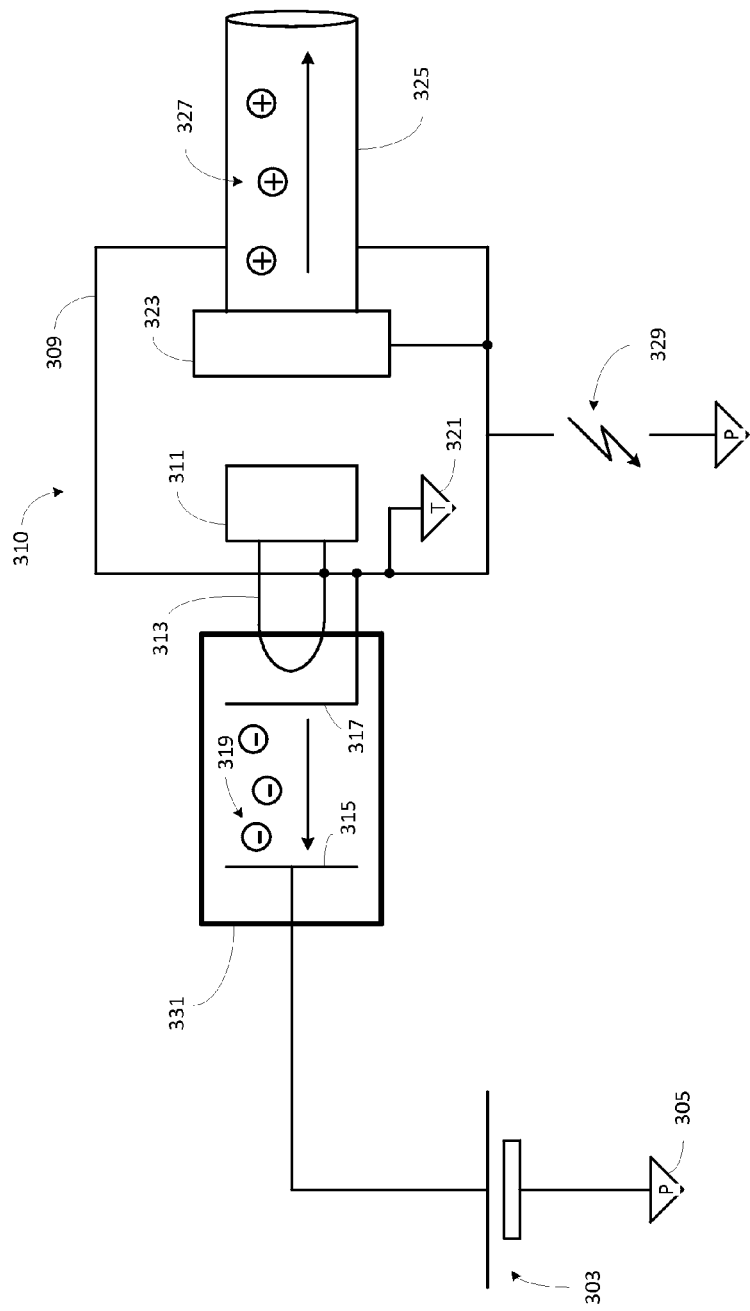
FIG. 3 illustrates a circuit diagram of an ion source assembly utilizing a non-linear thermionic diode as a current limiting component for a high voltage power supply according to an embodiment of the invention.

FIG. 3 illustrates a circuit diagram of an ion source assembly 310 that utilizes a non-linear thermionic diode assembly 331 as a current limiting component for a high voltage power supply 303 according to an exemplary embodiment of the present disclosure. A high voltage power supply 303 having a ground return 305 is coupled at its output to the anode 315 of a thermionic diode assembly 331. The cathode 317 of thermionic diode assembly 331, in turn, is coupled with an enclosure 309 of the ion source assembly 310. The cathode 317 is coupled with local ground 321 of ion source assembly enclosure 309. A filament power supply 311 powers filament 313 that heats cathode 317. During normal operation a current of positive ions 327 is extracted from ion source 323 through beam line 325. For example, the ions may be extracted from the ion source 323 utilizing a standard extraction electrode configuration. A matching current of electrons 319 leaves ion source assembly enclosure 309 through thermionic diode 331. While the direction of electron current 319 is from high voltage power supply 303 to ion source assembly enclosure 309, the actual movement of electrons is in the opposite direction.

The thermionic diode 331 coupled between the high voltage power supply 303 and the ion source assembly 310 functions to protect the high voltage power supply 303 by suppressing high current surges caused by arcs 329 that can cause that damage or wear out high voltage power supply 303.

In general, a diode is a non-linear two-terminal electronic component that conducts electric current in only one direction. The embodiment described above with reference to FIG. 3 describes a specific type of diode implementation known as a thermionic diode (also known as a vacuum tube diode) which is a vacuum tube with two electrodes: an anode plate 315 and a cathode 317.

By way of background, in thermionic diodes a current through a heater filament (also known as a cathode filament) indirectly heats the cathode. Some thermionic diodes use direct heating, in which a tungsten filament acts as both heater and cathode. The heat causes thermionic emission of electrons into a vacuum between the anode and cathode. In forward operation, a surrounding metal electrode called the anode is positively charged so that it electrostatically attracts the emitted electrons. However, electrons are not easily released from the unheated anode surface when the voltage polarity is reversed. Therefore, any reverse flow is negligible.

Another characteristic of a thermionic diode is that it will not pass more than its saturation current even at very high voltages. Saturation current is the maximum current that can be extracted from the cathode under certain conditions. Once the saturation current is reached a further increase in anode-cathode potential difference produces only a relatively small increase in current. Saturation current is controlled by shape, material and temperature of the cathode.

Compared to a resistor, the thermionic diode 331 is more robust because there is no solid material that is carrying current. Thus, effects like local overheating from hot spots or damaging current pinch cannot occur in a thermionic diode.

In particular, hot spots occur when operating current exceeds a threshold level. When such a condition occurs, the affected area is forced into reverse bias and must dissipate power, which can cause overheating. Current pinch is the compression of an electrically conducting filament by magnetic forces. Since there is no solid material carrying the current, there is no filament to pinch.

As previously mentioned, the purpose of the thermionic diode assembly 331 is to limit excessive current to high voltage power supply 303 during an arc failure. The presence of an arc 329 indicates failure and is typically caused by the electrical break down of the insulating medium around ion source assembly enclosure 309. Such an arc failure may be caused by any number of occurrences including, for example, minor dust deposits on surfaces exposed to the electric field. This causes a direct short from ion source assembly enclosure 309 to the ground return 305 of high voltage power supply 303. However, during such a failure, the thermionic diode 331 prevents excessive current flow to high voltage power supply 303. Since arc 329 does not receive significant additional energy from power supply 303 due to current limitation by thermionic diode 331, it extinguishes within a few micro seconds.

Figure 4:
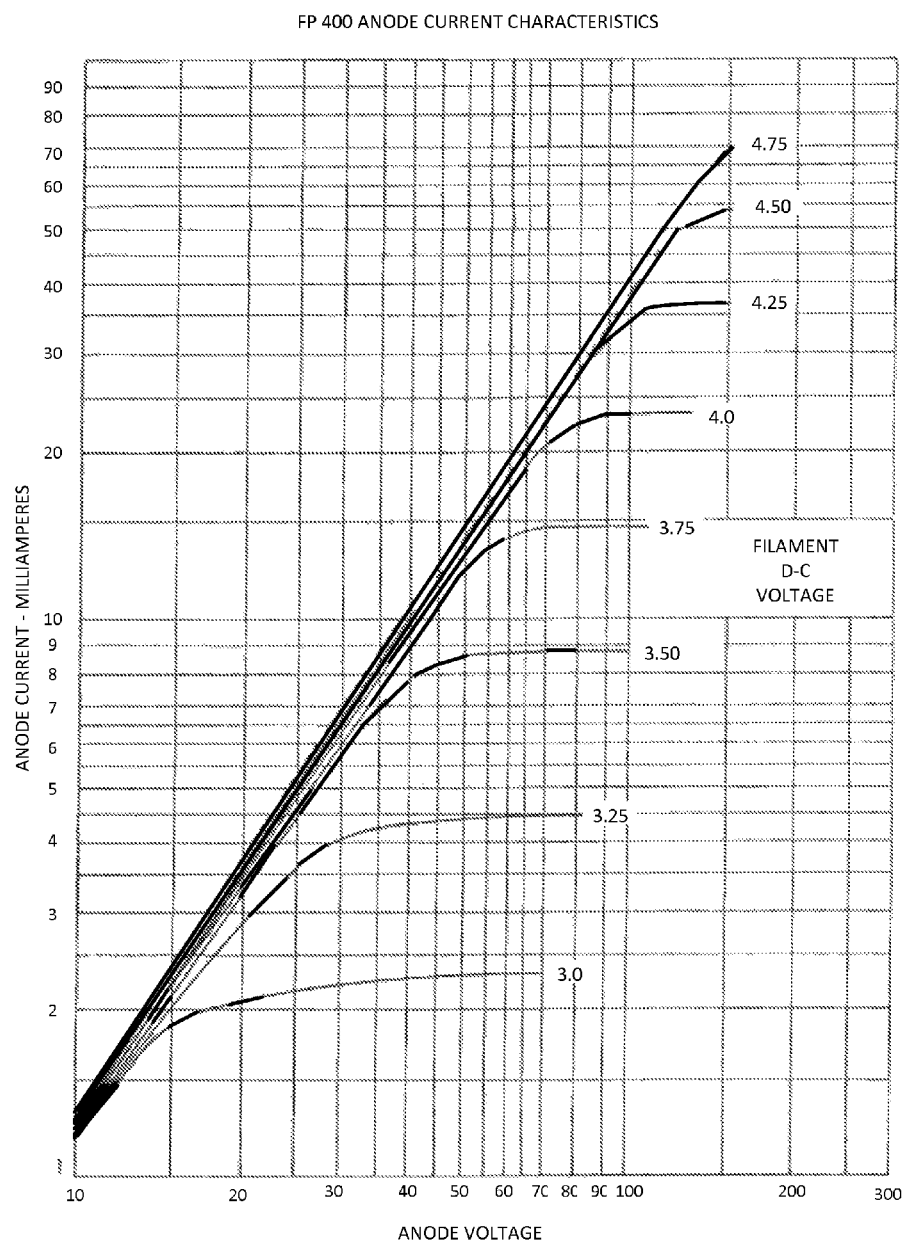
FIG. 4 illustrates the anode current characteristics of a typical thermionic diode.

The principle behind the current limiting feature is shown in FIG. 4 which illustrates the anode current characteristics of a typical thermionic diode. In normal operation, thermionic diode 131 operates in the Child-Langmuir region with less than a 100V voltage drop between the anode and cathode (left side of FIG. 4). During arc failure, current is limited by the saturation current of the thermionic diode. This is described by the Richardson-Dushman equation which represents the current density of electrons that leave a heated conductor in thermionic emission. This is illustrated on the right side of FIG. 4 where the curves flatten out because impedance becomes too large. The large impedance blocks high current discharge from the high voltage power supply. The actual value of the saturation current depends on the temperature and geometry of the cathode. In FIG. 4 the effect is illustrated as a family of curves each having a different anode voltage vs. anode current.

Commercial thermionic diodes require a high quality housing to maintain a vacuum over their entire life as well as carefully engineered cathodes to keep the power consumption low for heating power. However, due to the nature and components of an ion source assembly, both of these requirements are somewhat relaxed. For instance, vacuum is readily available from the ion source or the beam line system. Also, producing 10 ma to 20 ma of saturation current only requires a few watts of power which is easily attainable since the cathode filament used in a typical ion source assembly produces several amperes of saturation current at a few hundred watts of heating power.

Figure 5:
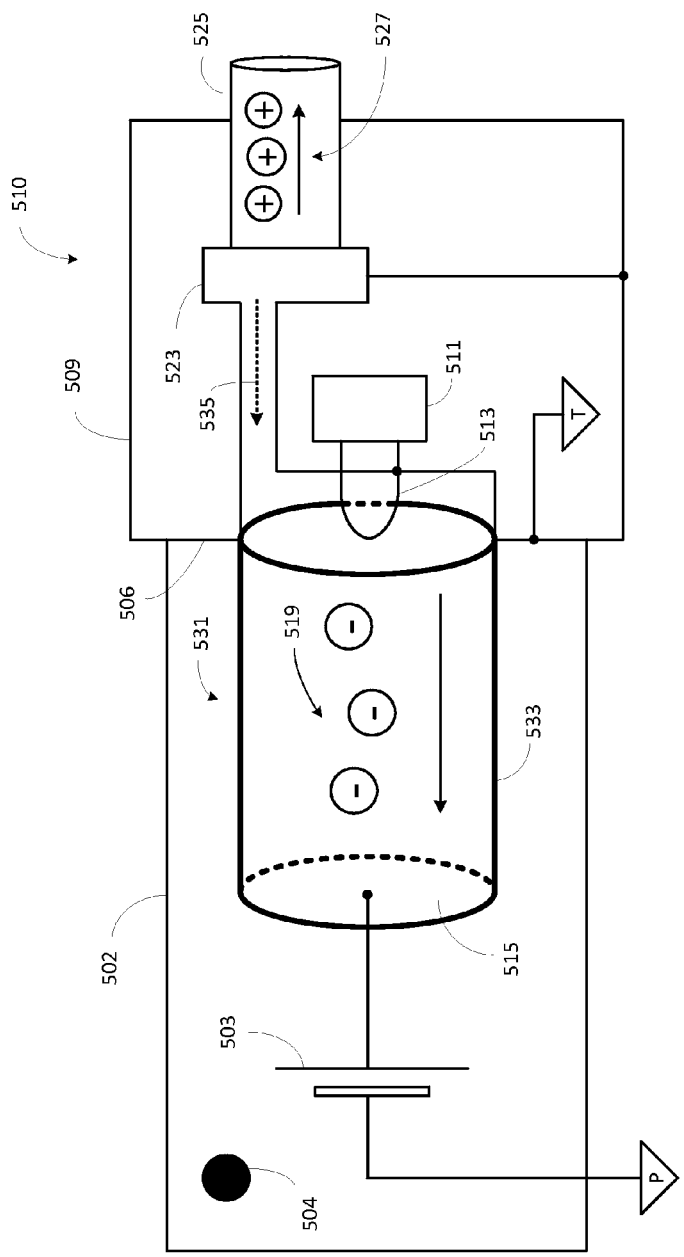
FIG. 5 illustrates a circuit/block diagram of an ion source assembly utilizing a non-linear thermionic diode as a current limiting component for a high voltage power supply according to an embodiment of the invention.

FIG. 5 illustrates a circuit/block diagram of an ion source assembly 510 utilizing a non-linear thermionic diode assembly 531 as a current limiting component for a high voltage power supply 503 according to an embodiment of the invention. A high voltage power supply 503 is enclosed in a pressure tank 502 that has its volume 504 typically filled with $SF_6$ gas or some other suitable gas for improved insulation. The housing of thermionic diode assembly 531 is implemented as an insulating tube 533 mounted to an endplate 506 of pressure tank 502 from the inside so as to form a vacuum seal with an outer skin of an enclosure 509. A metal electrode 515 forms the anode and also closes off the other end of insulating tube 533 within pressure tank 502. When sealed to enclosure 509 insulating tube 533 also includes a fluid connection 535 to the vacuum section of ion source 523 to accommodate fluid evacuation. A cathode filament 513 is mounted approximately flush with the outer skin of enclosure 509 within fluid connection 535. A filament power supply 511 provides power to cathode filament 513.

The insulating tube 533 can be relatively short and still withstand a typical voltage spike resulting from a failure arc. This is because there is a surface break down takes tens of micro-seconds to develop. Since an arc will not receive significant additional energy from power supply 503 due to current limitation by thermionic diode assembly 531, it extinguishes within a few micro seconds. Therefore 100 kV/inch voltage drop across the tube are acceptable. In addition, the surface may also be convoluted to increase the length of the creep path to provide even greater protection.

When used in series with the high voltage power supply, the thermionic diode assembly 531 limits discharge current during arcs which speeds up recovery after arcs. The ion source chamber is already under vacuum. Thus, adding a filament 513 and an isolated port with an electrode (e.g., anode 515) for the power supply will complete the thermionic diode assembly 531.

Given a suitable configuration of the vacuum chamber, electrons can be extracted from the backside of the cathode heating filament in an ion source using an indirectly heated cathode. All that is needed is a high voltage feed-through. Since metal anode 515 is joined vacuum tight to the insulating body of the tube 533 and is coupled the output of high voltage power supply 503, it acts as a high voltage feed-through.

Alternatively, a tungsten filament or a thoriated tungsten filament can act as both filament and cathode. Iridium is another possible cathode filament material. In general, the filament can comprise a refractive conductive material. Moreover, it is possible to implement the cathode as a cold cathode or a photo cathode. The term "cold cathode" refers to the fact that the cathode is not independently heated, but may still operate at an elevated temperature. Cold cathode devices typically use a complex high-voltage power supply with some mechanism for limiting current.

Figure 6:
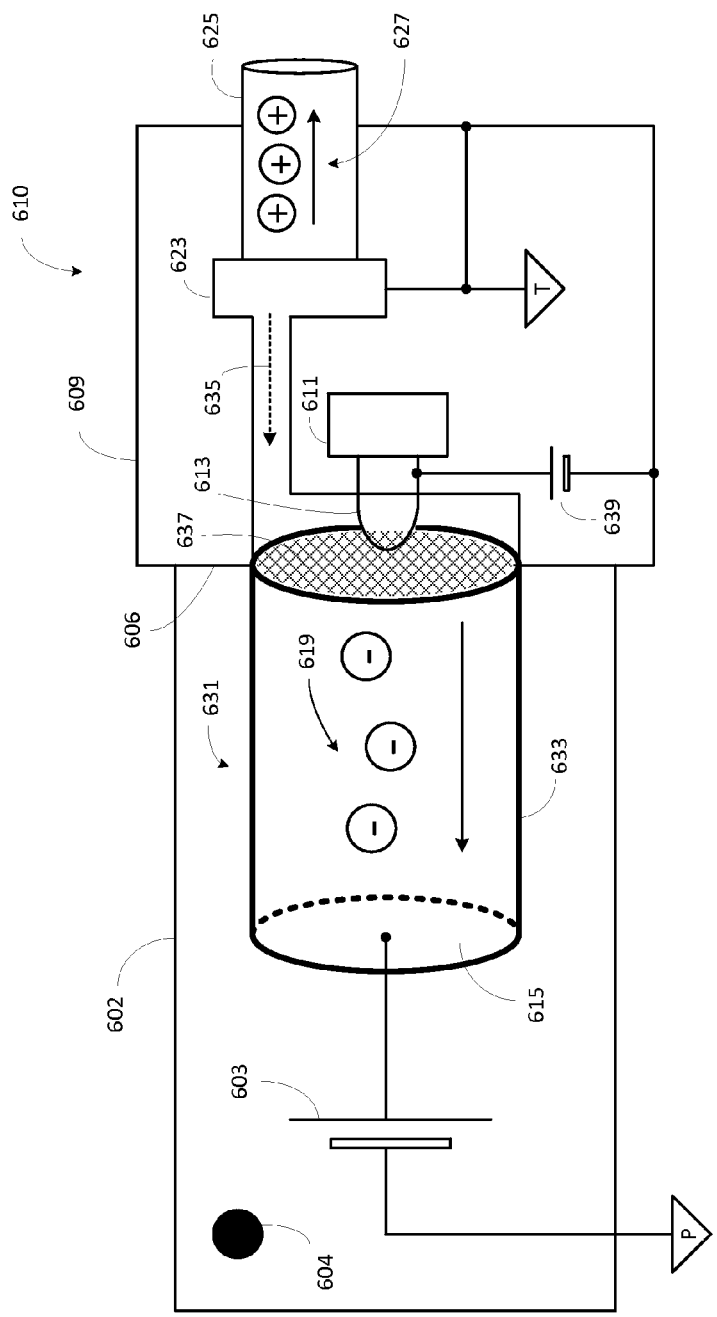
FIG. 6 illustrates a circuit/block diagram of an ion source assembly utilizing a non-linear thermionic triode as a current limiting component for a high voltage power supply according to an embodiment of the invention.

FIG. 6 illustrates a circuit/block diagram of an ion source assembly 610 utilizing a non-linear thermionic triode 631 as a current limiting component for a high voltage power supply 603 according to an embodiment of the invention. In this embodiment the thermionic diode structure of FIG. 5 is replaced with a thermionic triode structure 631. A high voltage power supply 603 is enclosed in source pressure tank 602. The volume 604 of pressure tank 602 is typically filled with $SF_6$ gas for improved insulation. The housing of thermionic triode 631 is implemented as an insulating tube 633 mounted to an endplate 506 of pressure tank 602 from the inside so as to form a vacuum seal with an outer skin of an ion source assembly enclosure 609. A metal electrode 615 forms the anode and also closes off the other end of insulating tube 633 within pressure tank 602. When sealed to enclosure 609 insulating tube 633 also includes a fluid connection 635 to the vacuum section of ion source 623 to accommodate fluid evacuation. A cathode filament 613 is mounted approximately flush with the outer skin of enclosure 609 within fluid connection 635. A filament power supply 611 provides power to cathode filament 613.

A grid bias power supply 639 provides a bias voltage between filament 613 and grid 637. The thermionic triode structure 631 is formed by perforating the outer skin to form a grid 637 between cathode filament 613 and anode 615. A grid bias power supply 639 is also added to bias cathode filament 613 relative to perforated outer skin 637 to adjust current to anode 615. A simple focusing element for cathode filament 613 such as, for instance, a Wehnelt cylinder can also be added.

Just as with the thermionic diode implementation, when used in series with the high voltage power supply 603, the thermionic triode 631 limits discharge current during arcs which speeds up recovery after arcs. The ion source chamber is already under vacuum. Thus, adding a filament 613 and an isolated port with an electrode (e.g., anode 615) for the power supply is all that is needed to complete the thermionic diode assembly 631. Given a suitable configuration of the vacuum chamber, electrons can be extracted from the backside of the cathode heating filament in an ion source using an indirectly heated cathode. All that is needed is a high voltage feed-through. Since metal anode 615 is joined vacuum tight to the insulating body of the tube 633 and is coupled the output of high voltage power supply 603, it acts as a high voltage feed-through.

The thermionic triode assembly 631 offers better shielding of the ion source assembly 610 than the thermionic diode assembly 531 in FIG. 5 because the cathode filament 613 is never directly exposed to any high voltage field. The thermionic triode assembly 631 could also be used for rapid control of the operating current by adjusting the bias voltage instead of cathode filament temperature.

The devices illustrated in FIGS. 5-6 are tailored to the requirements and available resources of ion source assemblies. For instance, ion source assemblies require a relatively low current with only coarse limit control. Further, there is a vacuum pump (within ion source 523) and power supply 511 already resident on the ion source assembly 510. Once implemented, the thermionic diode and triode assemblies can exhibit other useful characteristics. For instance, both the thermionic diode 531 and triode 631 assemblies can be used as a simple switch. When the cathode 513, 613 is cold there is no conduction. This is useful when the ion source assembly 510, 610 is driven below ground of the high voltage power supply 503, 603 in an operating mode known as deceleration mode. In addition, the thermionic triode assembly 631 offers superior shielding against electromagnetic interference (EMI) when compared to a high voltage relay with leads.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A surge protection system for use with an ion source assembly, the system comprising:
   (i) an ion source assembly comprised of:
     an ion source;
     an enclosure having an outer skin surface;
     a fluid connection assembly coupling a vacuum section of the ion source with the outer skin surface of the enclosure; and
     a cathode comprised of a cathode filament power supply and a cathode filament disposed within the fluid connection assembly and mounted substantially flush with the outer skin surface of the ion source assembly enclosure;
   (ii) a high voltage power supply enclosed in a pressure tank for driving the ion source assembly; and
   (iii) a thermionic diode assembly comprising an insulating tube coupled in series between an output of the high voltage power supply and the enclosure of the ion source assembly.

2. The surge protection system of claim 1 wherein the insulating tube is mounted on one end to an endplate of the pressure tank that is proximate to the cathode so as to form a vacuum seal with the outer skin surface of the enclosure of the ion source assembly and sealed on the other end by an anode that is coupled to an output of the high voltage power supply.

3. The surge protection system of claim 2 wherein the cathode filament is comprised of tungsten.

4. The surge protection system of claim 2 wherein the cathode filament is comprised of thoriated tungsten.

5. The surge protection system of claim 2 wherein the cathode is an indirectly heated cathode.

6. The surge protection system of claim 2 wherein the cathode filament is comprised of iridium.

7. The surge protection system of claim 2 wherein the cathode is a cold cathode.

8. The surge protection system of claim 2 wherein the cathode is a photo cathode.

9. A surge protection system for use with an ion source assembly, the system comprising:
   (i) an ion source assembly comprised of:
     an ion source;
     an ion source assembly enclosure having an outer skin surface wherein the outer skin surface is perforated in a region such that a grid is formed between a cathode and an anode;
     a fluid connection assembly coupling a vacuum section of the ion source with the outer skin surface of the ion source assembly enclosure; and
     a cathode comprised of a cathode filament power supply and a cathode filament disposed within the fluid connection assembly and mounted substantially flush with the outer skin surface of the ion source assembly enclosure;
     a bias power supply that biases the cathode filament relative to the outer skin surface of the ion source assembly enclosure;
   (ii) a high voltage power supply enclosed in a pressure tank for driving the ion source assembly; and
   (iii) a thermionic triode assembly comprising an insulating tube coupled in series between an output of the high voltage power supply and the ion source assembly enclosure.

10. The surge protection system of claim 9 wherein the insulating tube is mounted on one end to an endplate of the pressure tank that is proximate to the cathode so as to form a vacuum seal with the outer skin surface of the ion source assembly enclosure and sealed on the other end by an anode that is coupled to an output of the high voltage power supply.

11. The surge protection system of claim 10 further comprising a focusing element for the cathode filament.

12. The surge protection system of claim 11 wherein the focusing element for the cathode filament is a Wehnelt cylinder.

13. The surge protection system of claim 10 wherein the cathode is an indirectly heated cathode.

14. The surge protection system of claim 10 wherein the cathode filament is comprised of tungsten.

15. The surge protection system of claim 10 wherein the cathode filament is comprised of thoriated tungsten.

16. The surge protection system of claim 10 wherein the cathode filament is comprised of iridium.

17. The surge protection system of claim 10 wherein the cathode is a cold cathode.

18. The surge protection system of claim 10 wherein the cathode is a photo cathode.

* * * * *